(12) United States Patent
Lutz et al.

(10) Patent No.: US 9,985,598 B2
(45) Date of Patent: May 29, 2018

(54) FREQUENCY COMPENSATED OSCILLATOR DESIGN FOR PROCESS TOLERANCES

(71) Applicant: Robert Bosch GmbH, Stuttgart (DE)

(72) Inventors: Markus Lutz, Palo Alto, CA (US); Aaron Partridge, Palo Alto, CA (US)

(73) Assignee: ROBERT BOSCH GMBH, Stuttgart (DE)

( * ) Notice: Subject to any disclaimer, the term of this patent is extended or adjusted under 35 U.S.C. 154(b) by 350 days.

(21) Appl. No.: 14/728,930

(22) Filed: Jun. 2, 2015

(65) Prior Publication Data

US 2015/0263695 A1    Sep. 17, 2015

Related U.S. Application Data

(62) Division of application No. 10/679,115, filed on Oct. 3, 2003, now abandoned.

(51) Int. Cl.
*H03H 3/007* (2006.01)
*H03H 9/24* (2006.01)
*H03H 9/02* (2006.01)

(52) U.S. Cl.
CPC ........ *H03H 3/0072* (2013.01); *H03H 3/0076* (2013.01); *H03H 3/0077* (2013.01); *H03H 9/2447* (2013.01); *H03H 9/2457* (2013.01); *H03H 9/2463* (2013.01); *H03H 2009/0233* (2013.01); *H03H 2009/02299* (2013.01); *H03H 2009/02496* (2013.01); *Y10T 29/49016* (2015.01)

(58) Field of Classification Search
CPC .. H03H 3/0072; H03H 3/0076; H03H 3/0077; H03H 9/2447; H03H 9/2457; H03H 9/2463; H03H 2009/0299; H03H 2009/0233; H03H 2009/02496
USPC .................................................. 331/154, 156
See application file for complete search history.

(56) References Cited

U.S. PATENT DOCUMENTS

| | | | | |
|---|---|---|---|---|
| 2,318,936 A | * | 5/1943 | Fisher | G10H 3/12 331/106 |
| 4,350,918 A | * | 9/1982 | Sato | G04F 5/063 310/320 |
| 5,610,335 A | | 3/1997 | Shaw et al. | |
| 5,635,642 A | * | 6/1997 | Nonomura | G01C 19/5607 73/504.16 |
| 5,683,591 A | | 11/1997 | Offenberg | |
| 5,719,073 A | | 2/1998 | Shaw et al. | |
| 5,804,083 A | | 9/1998 | Ishii et al. | |
| 5,804,087 A | * | 9/1998 | Lee | G01C 19/5769 216/41 |

(Continued)

FOREIGN PATENT DOCUMENTS

DE    19819458 A    11/1999

*Primary Examiner* — Levi Gannon
(74) *Attorney, Agent, or Firm* — Norton Rose Fulbright US LLP; Gerard Messina

(57) ABSTRACT

A continuous or distributed resonator geometry is defined such that the fabrication process used to form a spring mechanism also forms an effective mass of the resonator structure. Proportional design of the spring mechanism and/or mass element geometries in relation to the fabrication process allows for compensation of process-tolerance-induced fabrication variances. As a result, a resonator having increased frequency accuracy is achieved.

22 Claims, 7 Drawing Sheets

(56) References Cited

U.S. PATENT DOCUMENTS

| | | |
|---|---|---|
| 5,914,553 A | 6/1999 | Adams et al. |
| 5,922,212 A | 6/1999 | Kano et al. |
| 5,979,246 A * | 11/1999 | Van Cleve ............ G01F 1/8409 |
| | | 73/861.357 |
| 6,073,484 A | 6/2000 | Miller et al. |
| 6,119,518 A | 9/2000 | Itou et al. |
| 6,303,512 B1 | 10/2001 | Laermer et al. |
| 6,318,175 B1 | 11/2001 | Muchow et al. |
| 6,318,177 B2 | 11/2001 | Buchan et al. |
| 6,367,786 B1 | 4/2002 | Gutierrez et al. |
| 6,632,698 B2 | 10/2003 | Ives |
| 6,707,351 B2 | 3/2004 | Gorrell |
| 6,744,174 B2 | 6/2004 | Paden et al. |
| 2001/0017058 A1 | 8/2001 | Buchan et al. |
| 2002/0190607 A1 | 12/2002 | Paden et al. |
| 2003/0062961 A1 * | 4/2003 | Ma ..................... B81B 3/0078 |
| | | 331/100 |

* cited by examiner

FREQUENCY COMPENSATED OSCILLATOR DESIGN FOR PROCESS TOLERANCES

CROSS-REFERENCE TO RELATED APPLICATIONS

This application is a divisional application of U.S. patent application Ser. No. 10/679,115, filed Oct. 3, 2003, the contents of which is incorporated herein by reference in its entirety.

BACKGROUND

The present invention relates generally to the design and fabrication of resonators. Resonators formed in accordance with the present invention find application, for example, within oscillators. Within the field of micro-electro-mechanical systems (MEMS), oscillators are critical components. The functionality of many micro-mechanical structures, including oscillators, is based on the reaction (e.g., oscillation, deflection, or torsion) of a spring mechanism to an applied force. Such "spring mechanisms" are typically formed from one or more beam structures having, or modeled to have, a rectangular cross section of predetermined width. The physical structure of a spring mechanism is typically formed using a sequence of planar or surface micro-machining fabrication processes. The degree to which a spring mechanism actually takes the form intended by its design is a function of the precision with which the one or more fabrication processes are applied to a layer or segment of a constituent material used to form the spring.

Fabrication processes are applied with well-understood tolerances. That is, variations normally occurring in the application of a particular fabrication process result in a micro-mechanical structure having physical dimensions that vary from its design specifications. For relatively large structures, such small, process-tolerance-induced variations are immaterial. However, MEMS components are so small and their functionality so demanding that even relatively minor variations from specification will adversely influence performance.

For example, the anisotropy of an etching method used to form a beam structure will determine the exact width of the beam and any variance of that width from design specifications. Line width control during lithography processes will similarly influence the physical dimensions of a beam structure.

Process-tolerance-induced variations can result in spring mechanisms having actual widths that differ greatly from their intended design. Since a spring mechanism's width defines its stiffness, and since the ratio of resonator stiffness to resonator mass defines a resonator's frequency response to an external stimulus, significant variations in spring width are unacceptable. Currently in the known quartz resonators, such variations are corrected by trimming the mechanical structure to better define its frequency in relation to its intended design. However, trimming for silicon based resonators is not a fabrication solution readily adapted to the reliable mass manufacture of resonator components. In order to produce precise resonators using silicon batch processing, a better design and/or fabrication solution is required.

SUMMARY OF THE INVENTION

The present invention provides a resonator structure having increased immunity to process-tolerance-induced variations in geometry. That is, resonators designed and formed in accordance with the present invention may be produced with greater manufacturing yield since the ratio of effective spring stiffness to effective mass of the resonator is well maintained in relation to the fabrication process forming the resonator.

Thus, in a first aspect, a resonator according to the present invention provides a spring mechanism having an actual width defining an effective mechanical stiffness and a mass element having an effective mass. The actual width of the spring mechanism is defined by a fabrication process used to form, in one example, a beam structure from a constituent material. Further, the mass element has a geometry defined such that formation of the actual width by the fabrication process results little change to a ratio defined by a change in the effective mechanical stiffness and a change in the effective mass.

In a second, related aspect, the present invention provides a resonator comprising a spring mechanism of predetermined length having an actual width defining a mechanical stiffness for the spring mechanism, a defined geometry, and an effective mass. The actual width and the effective mass of the beam structure are simultaneously defined by application of a fabrication process to a constituent material. The geometry is defined such that application of the fabrication process to the constituent material results in little change to a ratio defined by a change in the effective mechanical stiffness and a change in the effective mass.

The present invention also provides a method of forming a resonator. In one aspect, the method comprises the steps of defining geometry for a spring mechanism, including an actual width that defines a mechanical stiffness for the spring mechanism, in relation to a fabrication process used to form the spring mechanism from a constituent material. The method further defines geometry for a mass element characterized by an effective mass in relation to the fabrication process. Upon application of the fabrication process to the constituent material little change results in a ratio defined by a change in the effective mechanical stiffness and change in the effective mass.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. It is understood that various combinations of the structures, components, materials and/or elements, other than those specifically shown, are contemplated and are within the scope of the present invention.

DETAILED DESCRIPTION

Figure 1A:
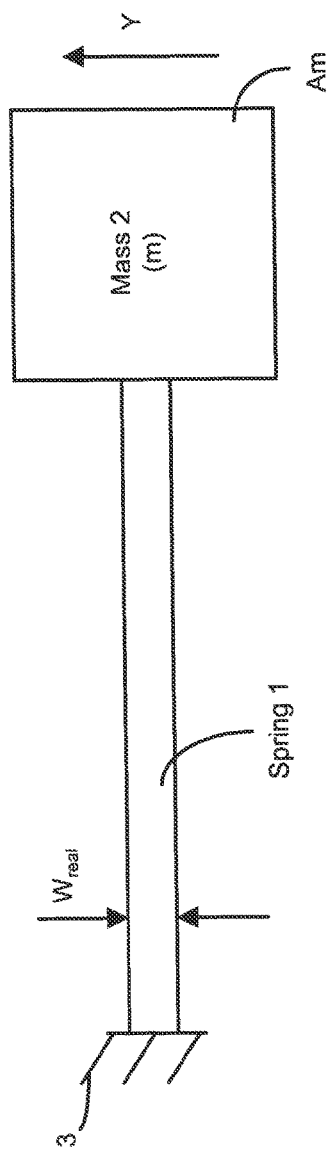
FIG. 1A illustrates a conventional, discrete resonator structure.

A number of teaching embodiments are presented below which describe to making and use of the present invention. The embodiments are selected examples. The full scope of the present invention is, however, defined by the claims that follow. Examples of discrete, continuous, and hybrid resonators are presented below. Those of ordinary skill in the art will recognize that the distinction between broad resonator classes is done for purposes of clarity. The present invention is readily applicable to at least the entire range of resonator structures adapted for use in MEMS.

The term "beam" or "beam/mass structure" is used to broadly denote a class of mechanical elements commonly used in MEMS to define a frequency of interest. Beams take many specific forms and may be used, for example, in the suspension of rigid plates, as lateral oscillators, or as cantilever devices. Beam structures are a natural choice for bearing-less motion detectors. Of particular note, MEMS increasingly use beams within resonator or oscillator structures, such as clock and signal filtering circuits. Hereafter, the term "resonator" will be used to describe any circuit or circuit component comprising an element designed to move, vibrate, react, and/or oscillate to identify, respond to, and/or generate a frequency of interest. The term "resonator" embraces mechanical, electrical, and electro-mechanical means for accomplishing the foregoing. The term "spring" or "spring mechanism" is used to broadly connote any element, regardless of geometry, having an effective mechanical stiffness and susceptible to use within a resonator.

Regardless of variation in specific geometry or intended use, resonators may be conceptually viewed as being continuous, discrete, or hybrid (as between continuous and discrete) in nature. For purposes of the explanation that follows, a discrete oscillator system comprises one or more independent spring mechanisms having prescribed stiffness (es) and corresponding mass element(s). The designation "discrete" is used merely for clarity of explanation and it is well recognized that no resonator structure is completely discrete since the spring mechanism contribute some mass to the oscillation response of the system. In similar vein, every mass element is subject to some bending under the influence of an external force. Hence, the term "effective" is used to described an overall mechanical stiffness for a resonator. The mass element is characterized by an effective mass. The term "effective mass" describes the mass of the mass element as it actually exists within the operative, discrete oscillator, and is often distinct from the design mass specified for the resonator. Within the discrete oscillator system, both the spring mechanism and mass element are said to have respective geometries. The term "geometry" is used to broadly connote the physical dimensions (e.g., one or more of—height, width, length, radius, angle, circumference, thickness, etc.) and/or the layout design specified for a spring mechanism and/or mass element.

The effective mass of the mass element(s) within the discrete oscillator system, as well as the stiffness of the of the resonator structures define the resonance frequency (f) of the oscillator accordingly to the following relationship:

$$f = \frac{1}{2\pi} \sqrt{\frac{\text{stiffness}}{\text{mass}_{(effective)}}} \quad \text{Equation 1}$$

In contrast to the discrete oscillator, a continuous oscillator comprises a spring mechanism without an independent mass element. In continuous oscillators formed, as presently preferred, from a beam structure, the beam structure constitutes both the mass and stiffness components of the resonator.

FIG. 1A generally shows a discrete oscillator system including a spring mechanism 1 fixed at one end to an anchor 3 and at the other end to mass element 2. Spring mechanism 1 and mass 3 are independent one from the other.

Figure 1B:
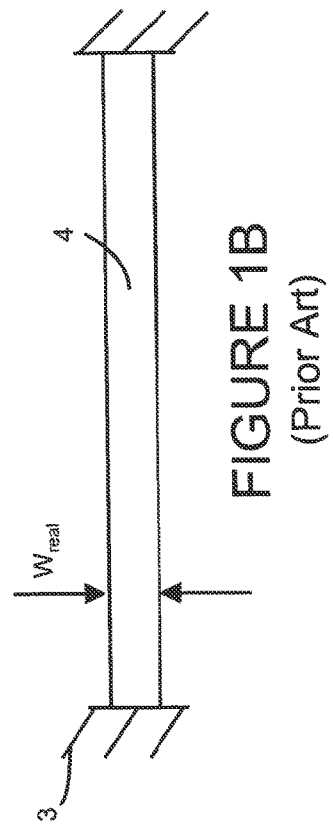
FIG. 1B illustrates a conventional, continuous resonator structure.

FIG. 1B generally shows a continuous oscillator consisting of spring mechanism 4 fixed at either end by anchors 3.

In each oscillator type, the spring mechanism possesses a mechanical stiffness ($k_Y$) in the lateral direction Y that is cubic to its actual width ("$W_{real}$"). The term "actual width" describes the width of the spring mechanism, typically a beam structure, as it actually exists within an operative oscillator, and is often distinct from the design width specified for the oscillator. The actual width, $W_{real}$, of a spring mechanism is a function of the beam's design width ("$W_{design}$") more or less some undercut value ("uc") attributable to a fabrication process used to form the spring mechanism from a constituent material layer.

The term "fabrication process" describes a single fabrication step or a sequence of steps that may be used to form a spring mechanism or mass element from a constituent material. Those of ordinary skill in the art will recognize many conventional fabrication steps or sequence of steps that may be used to form a spring mechanism or mass element from a wide choice of conventional, constituent materials. Further, the term "constituent material" is not limited to only homogenous materials, but describes any single material or combination of materials susceptible to a fabrication process, such that a spring mechanism or mass element may be formed.

The term "undercut" generally describes the physical response of a constituent material to a fabrication process. Conventional etching processes are ready examples of a fabrication process forming an oscillator element from a constituent material layer. Anisotropic, fluorine-based, plasma etching, such as that described in U.S. Pat. No. 6,303,512 to Laermer et al. may be used to good effect within the context of the present invention. More specifically, the term "undercut" describes the accuracy with which a selected fabrication process may be applied to the constituent material. Any lack of accuracy or "error" induced by a fabrication process may be attributable to, for example, variances in a photolithography step, non-vertical wall etching, etc.

The "total undercut value (uc)," is actually the sum of two factors including; a "nominal undercut value (un)," and a "tolerance of undercut value (tu)." Undercuts may be positive or negative. A positive undercut will remove more constituent material during a fabrication process than is intended by design. Positive undercut "errors" thus result in narrower resonator components. A negative undercut will remove less constituent material than intended by the design, and result in wider resonator components. Typical total undercut values are positive and generally range from 0.1 μm to 1 μm. The foregoing relationship may be stated as follows:

$$W_{real} = W_{design} - uc = W_{design} - (un +/- tu) \quad \text{Equation 2}$$

Nominal undercut values are well defined and understood for most fabrication processes and their corresponding range of fabrication conditions (e.g., temperature, pressure, time, gas flaw rate(s), etc.). As a result, the nominal "error" induced during the fabrication of a spring mechanism or mass element by a selected fabrication process may be specified to some degree of accuracy by the nominal undercut value. Accordingly, the nominal undercut value may be taken into account during design of a spring mechanism and/or mass element.

Figure 1C:
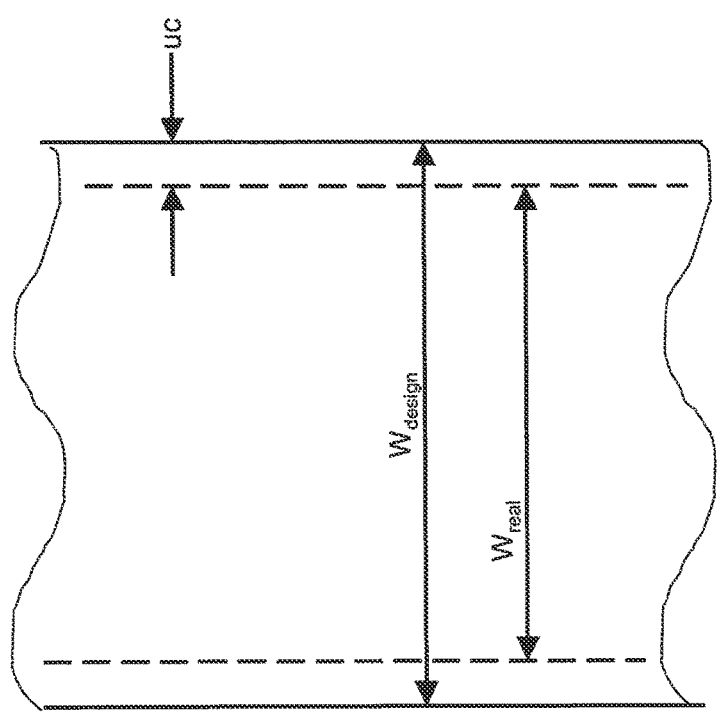
FIG. 1C generally illustrates a process by which a beam width is defined.

For example, looking at FIG. 1C, the design width, $W_{design}$, for a beam structure is typically specified to obtain a desired, actual width $W_{real}$ by adding (or possibly subtracting) the anticipated width margin associated with a nominal undercut value. In other words, the nominal undercut associated with a fabrication process may be pre-compensated or "sized into" the design.

Unfortunately, the same cannot be said for the variable tolerance of undercut value. The error occurring in the fabrication of a spring mechanism due to such process-tolerance-induced variations can not be compensated for during design. Until the present invention, this process-tolerance-induced fabrication error seriously impacts the accuracy with which MEMS resonators may be manufactured.

For example, conventional best practices have repeatedly been used to form a clamp-clamp beam structure designed to have an intended width of 4 μm, and an intended length 100 μm. However, these repeated attempts to consistently form an oscillator circuit having a spring mechanism width defining a 3.0 MHz frequency of interest have resulted in oscillators actually yielding output frequencies ranging from about 2.73 MHz to 3.24 MHz. This represents a total range of frequency error exceeding 17%. Such frequency variations are unacceptable and such contemporary spring mechanisms require extensive trimming to meet design specifications.

The present invention recognizes the important role played by the uncompensated tolerance of undercut associated with conventional fabrication processes. By designing and fabricating a spring mechanism in accordance with the present invention, resonators having much greater accuracy, approaching two or more orders of magnitude better than conventional resonators, may be produced without extensive trimming. Thus, in one aspect, the present invention recognizes that the mechanical stiffness of conventional spring mechanisms is often fundamentally impaired by undesired, process-tolerance-induced, variations in the width of the constituent beam(s) forming the spring mechanism. If a beam's width is too narrow in relation to its design, its mechanical stiffness will be too low. If too thick, its mechanical stiffness will be too high.

The present invention compensates for variations in spring mechanism stiffness as the result of process-tolerance-induced errors by altering the effective mass of a corresponding mass element in a discrete oscillator in a proportional, offsetting manner. Returning to FIG. 1A, as an illustrative example, the mechanical stiffness $k_y$ of a spring mechanism in the Y (lateral) direction is proportional to its effective width, $W_{real}$. This relationship may be expressed as:

$$k_y = \frac{E * h * W_{real}^3}{4 * l^3}, \quad \text{Equation 3}$$

where E is Young's Modulo, h is the beam height, and l is the beam length.

Substituting the expression in Equation 2 for $W_{real}$ above yields:

$$k_y = \frac{E * h * (W_{design} - uc)^3}{4 * l^3}. \quad \text{Equation 4}$$

The effective mass (m) of an assumedly rectangular beam structure forming the spring mechanism may be defined as:

$$m = V*r = (A*h*r) = (l*W_{real}*h*r) \quad \text{Equation 5,}$$

where V is volume, r is density of the constituent material, A is the surface area of the upper face, and h is again the height of the beam.

Recalling equation 1, the resonance frequency (f) of this beam structure may be expressed as:

$$f = \frac{1}{2 \cdot \pi} \cdot \sqrt{\frac{k_y}{m}}. \quad \text{Equation 5}$$

Thus, in order to obtain a desired resonance frequency that is independent of process-tolerance-induced variations, the ratio $k_y/m$ must be kept constant.

Continuing with the working assumption of a spring mechanism fabricated from a rectangular beam structure and formed using conventional planar or surface micro-machining technologies, any process-tolerance-induced variance in the width of the spring mechanism will occur as an undercut error through the surface area A of the upper face of the beam. Since the process-tolerance-induced undercut error is applied uniformly in FIG. 1A through the upper surface of spring mechanism 1 and the upper surface of mass element 2, a proper definition of surface area $A_m$ for the mass 2 can be used to effectively compensate for the process-tolerance-induced undercut errors.

Stated in other terms, the present invention identifies a solution to the problem of resonance frequency variations in discrete oscillators caused by variations in the mechanical stiffness of a spring mechanism as caused by process-tolerance-induced undercut errors. This solution properly defines the surface area of a corresponding mass in such a way that the same process-tolerance-induced undercut error removes a corresponding, and therefore compensating, portion of mass m. Effective mass is changed proportional to variations in actual width of the spring mechanism. As a result, referring again to equation 5, effective mass (m) changes in proportional accordance with variations in the mechanical stiffness ($k_y$) of the beam structure under the influence of a fabrication process, such that the ratio $k_y/m$ remains constant.

The concept of "proportionality" needs some emphasis at this point. As can be seen from equations 1 and 4 above, within the context of the working example, a process-tolerance-induced undercut will affect the width of a spring mechanism and hence its mechanical stiffness $k_y$, in a cubic manner while simultaneously affecting the effective mass in only the first order. (This relationship further assumes that mass element 2 and spring mechanism 1 are formed from the same constituent material). Other proportionality relationships will exist for other geometries, and beam-mass combinations of differing constituent material compositions. However, regardless of specific geometry and/or composition, the present invention provides, at least in one aspect, for maintenance of the following relationship:

$$\frac{\partial}{\partial uc}\left(\frac{k_y}{m}\right) = 0. \qquad \text{Equation 6}$$

The lack of an exact proportionality constant between mechanical stiffness and actual mass, as well as normally occurring, yet unaccounted for variations in implementation of the fabrication process will typically preclude maintenance of the foregoing ratio at exactly zero. Thus, hereafter, the term "little change" will be used to describe best reasonable efforts to maintain at near zero the ratio between the change in mechanical stiffness of the spring mechanism and the change in the actual mass of the mass element. In a practical context, incorporation of the teachings of the present invention into the design and fabrication of a discrete oscillator has been experimentally shown to reduce the oscillator's frequency error by one to two orders of magnitude, within the tolerance of undercut (+/−tu), as compared with conventional oscillators of similar design.

Figure 2:
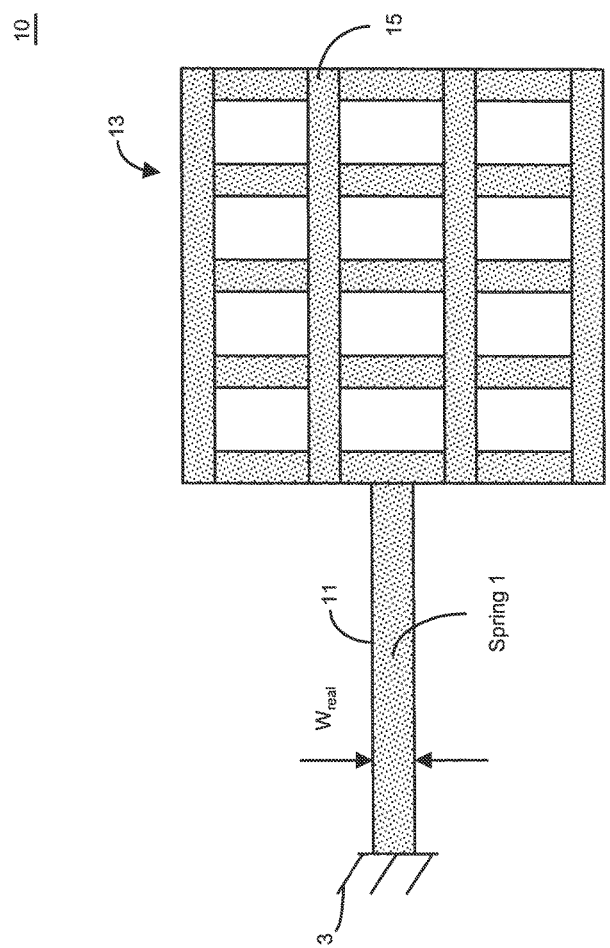
FIG. 2 illustrates an exemplary embodiment of discrete resonator structure formed in accordance with the present invention.

There are numerous ways to implement a scheme whereby process-tolerance-induced variations in the mechanical stiffness of a spring mechanism are compensated by proportional changes in a corresponding effective mass. Extending the example discussed in relation to FIG. 1A, a proposed discrete oscillator 10 is shown in FIG. 2. Here, spring mechanism 11 having effective width $W_{real}$ is connected between anchor 3 and mass element 13. Unlike the solid, conventional mass shown in FIG. 1A, mass element 13 is formed from a plurality of beam structures 15 preferably formed from the same material as spring mechanism 11, and, preferably, having widths $W_{mass}$, where $W_{mass}$ is ⅓ as wide as $W_{real}$. This plurality of stacked and/or interconnected beams 15 creates a mass element geometry that has relatively greater exposure to the effects of fabrication process undercut. Accordingly, relatively more mass is lost to the effects of a positive undercut. Any process-tolerance-induced undercut error associated with the fabrication process is applied equally to the width of spring mechanism 11 and the respective widths of the plurality of beams 15 forming mass element 13. Accordingly, the tolerance of undercut associated with the fabrication process will tend to move (increase or decrease) both the mechanical stiffness of spring mechanism 11 and the effective mass of mass element 13 in a similar manner. Where the geometry of mass element 13 is appropriately selected in proportion to the width of spring mechanism 11, little change results in the ratio of change in mechanical stiffness to the change in effective mass.

In the example of FIG. 2, the area of the mass element 13 can be expressed as:

$$A = N * W_{real} * l = N * W_{deisgn} - uc) * l \qquad \text{Equation 7,}$$

where N is the number and l is the length of the plurality of uniformly formed beams 15. The effect of the fabrication process (i.e., the induced change) on the effective mass of mass element 13 may be calculated in relation to the area A, and in relation to the rate of reaction between the fabrication process and constituent material forming the plurality of beams 15.

Figure 3A:
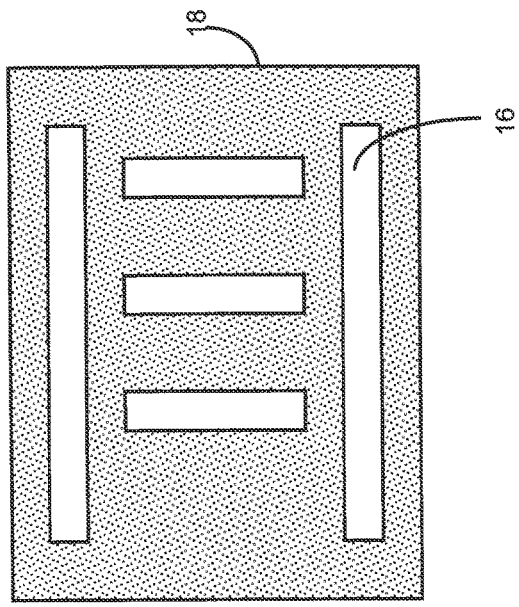
FIGS. 3A and 3B are exemplary embodiments of mass element geometries adapted for use within the context of the present invention.
Figure 3B:
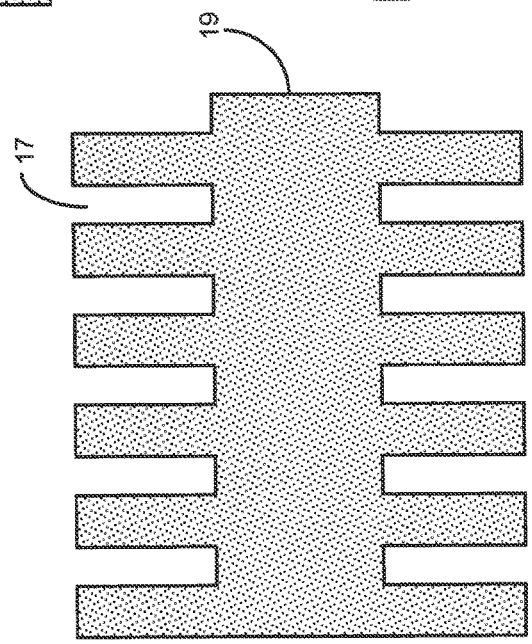

Other exemplary adaptations to the design and implementation of a mass element within a discrete oscillator system are shown in FIGS. 3A and 3B. In a first general concept shown in FIG. 3A, the geometry of mass element 18, as it is exposed to a planar (surface micro-machining) fabrication process, is modified up or down by the inclusion or removal of voids 16 within the body of mass element 18. The inclusion of additional voids 16 within body of mass element 18 increases the number of vertical edges acted upon by a typical planar fabrication process, and accordingly by an undercut associated with the fabrication process. Voids are included or removed as necessary to adjust the proportional reaction of mass element 18 to a selected fabrication process used to form the actual width of a corresponding beam structure (not shown in FIG. 3A).

In a second general concept shown in FIG. 3B, the geometry of mass element 19 is modified to include an outer edge having a plurality of indentations. The plurality of indentations has the effect of increasing the vertical edge length of mass element 19 exposed to the planar fabrication process, and accordingly an undercut associated with the fabrication process, used to form beam width, $W_{real}$. The term "indentations" as used hereafter denotes any discontinuous alteration in the outer edge of a mass element that has the effect of increasing over a straight outer edge geometry the quantity of outer edge exposed to a planer fabrication process. Thus, the term "indentation" includes orthogonal indentations, angular indentations, serrations, undulations, and similar geometries.

Either or both of the these techniques may be used in simulations, or in accordance with a mathematical calculation to define an expanded surface area for a mass element that is susceptible to the fabrication process forming beam width $W_{real}$ in such a manner that little change occurs in the ratio of change in mechanical beam stiffness and the change in actual mass.

The foregoing examples have been given in relation to conventional planar (or surface micro-machining) processes typically used to form lateral beam structures. Wet etches, dry etches, plasma etches, and vapor etches are all amenable to the principles of the present invention. Furthermore, the present invention may readily be used to compensate for process-tolerance-induced variations in out-of-plane oscillators, provided the geometric proportionality between changes in the critical parameter defining resonance frequency and changes in a corresponding effective mass can adequately be defined or determined in relation to one or more fabrication processes.

The foregoing examples all ascribe the change in effective mass to a single fabrication process being simultaneously used to define the actual width of a beam structure. The practicalities of this relationship are readily manifest and it is presently preferred to define mass element geometry in relation to the same fabrication process forming a corresponding beam structure width. Trimming of the mass element or beam is yet possible and can be conventionally performed, as necessary. However, recent experiments have shown that trimming is not necessary where mass element geometries are properly selected according to the dictates of the present invention. Indeed, resulting frequency errors of less than 0.15% (typical) have been achieved for oscillator designs previously exhibiting frequency errors greater/in the order of than 15%.

The examples thus far have all been drawn to discrete oscillator systems. Yet, the present invention is also applicable to continuous oscillator systems, such as those formed by the clamp-clamp beam structure shown in FIG. 1B.

Numerous alterations to the conventional clamp-clamp beam structure are contemplated within the context of the present invention. Several examples are shown in FIGS. 4A, 4B, and 4C.

Figure 4A:
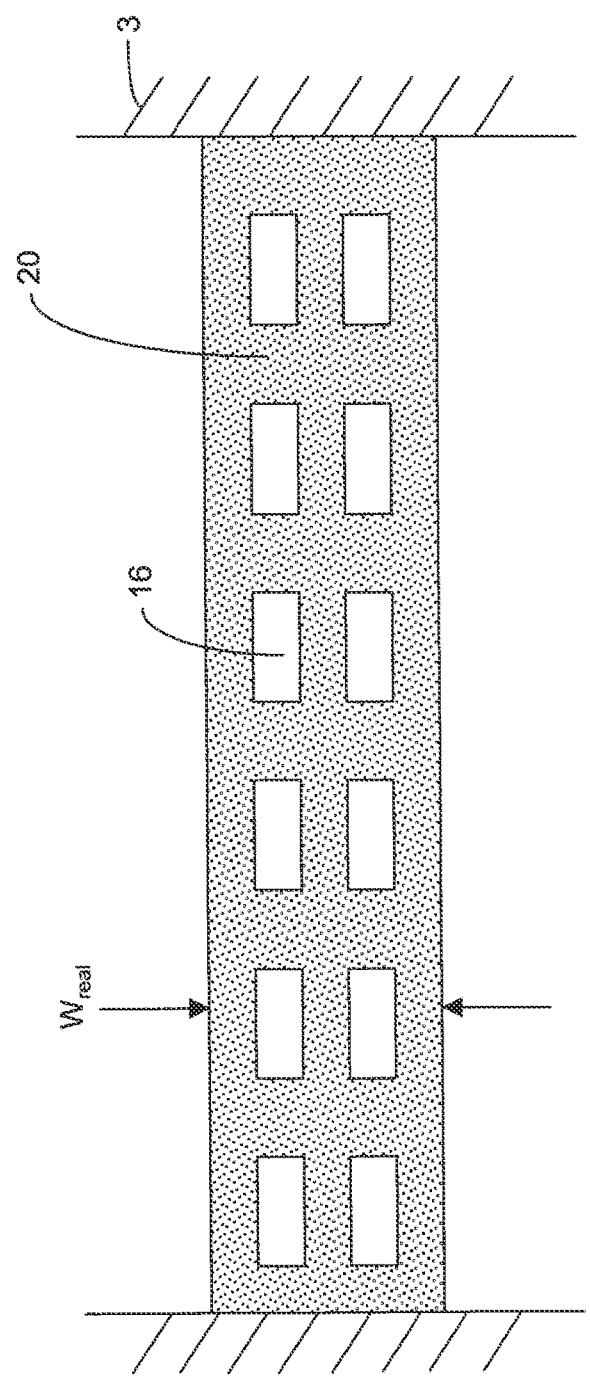
FIGS. 4A and 4B are exemplary embodiments of continuous resonator structures formed in accordance with the present invention; and, FIG. 4C is an exemplary embodiment of hybrid (discrete/continuous) resonator structure formed in accordance with the present invention.

In the example shown in FIG. 4A, voids 16 are formed in the length of spring mechanism 20 with a similar intent as that ascribed to the voids shown in FIG. 3A. Again, rectangular beam structures formed by conventional planar (or surface micro-machining) processes are assumed for purposes of this explanation, but the present invention is not so limited. The vertical edges formed in the length of spring mechanism 20 by voids 16 are necessarily affected by a planar fabrication process forming the actual width $W_{real}$ of beam 20 By careful inclusion of voids within the beam design, the mass of continuous spring mechanism 20 may be changed in proportion to the same process-tolerance-induced undercut error defining the actual width of the beam structure. Accordingly, any variance in the mechanical stiffness of the spring mechanism attributable to the fabrication process tolerances will be compensated for by proportional changes in the actual mass of the beam.

Figure 4B:
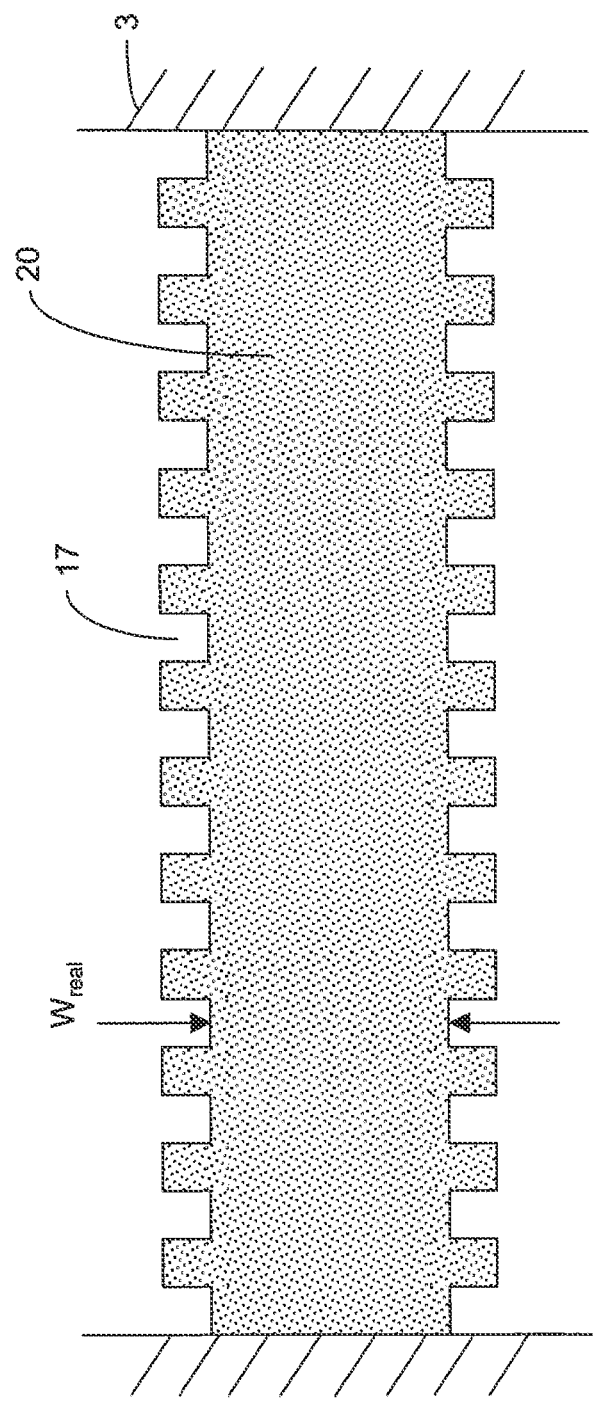

In the example shown in FIG. 4B, the outer edge of spring mechanism 20 is designed to include indentations 17 of sufficient number and form to maintain "little change" in the ratio of change in mechanical stiffness, as defined by the actual width of the beam $W_{real}$, to the change in actual mass of the beam under the influence of the fabrication process used to form the actual beam width.

Figure 4C:
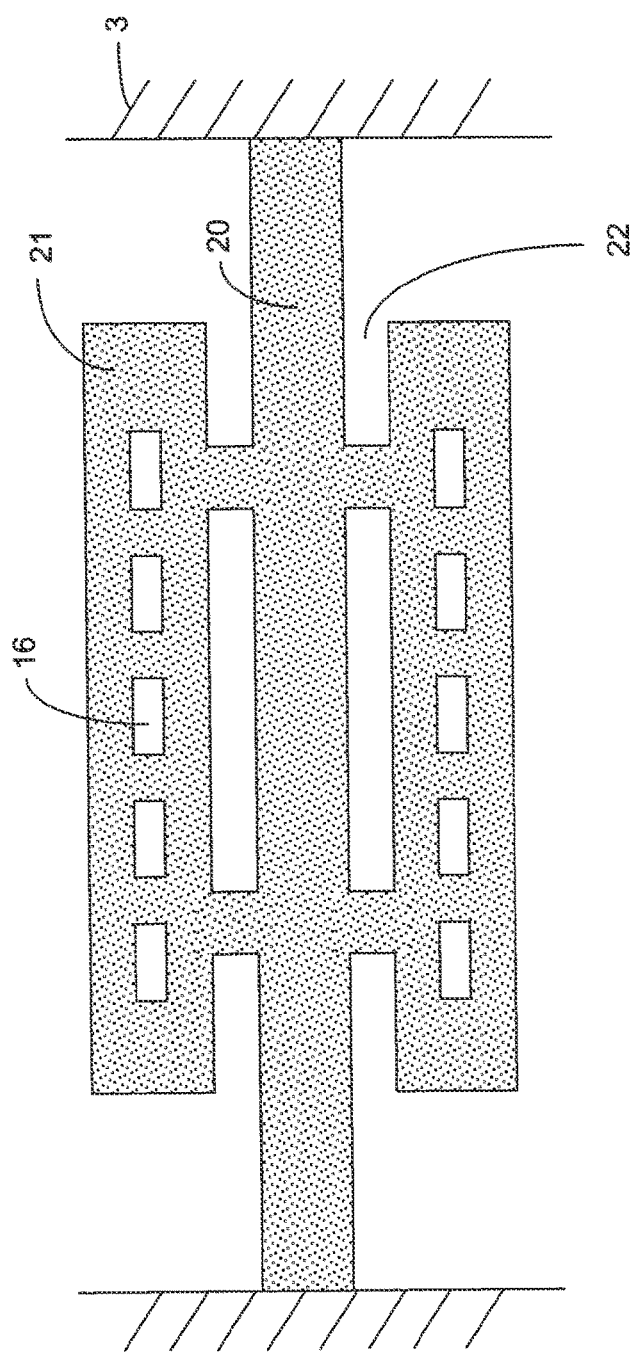

The example shown in FIG. 4C may be considered a hybrid design incorporating both discrete and continuous features. In this example, the geometry of spring mechanism 20 is more significantly altered to accomplish the dictates of the present invention. Here, one or more additional mass structures 21 are formed integral to spring mechanism 20. Additional mass structures 21 contribute to the overall mass of spring mechanism 20, and further define the effective mechanical stiffness of the whole structure. Consistent with the present invention, additional mass structures 21 make their contribution to the overall mass of spring mechanism 20 with an increased quantity of vertical edge area exposed to the fabrication process, as compared with the continuous spring mechanism geometries previously described. When exposed to the planar fabrication process forming beam 20, a properly defined geometry has the effect of maintaining little change in the ratio of change in the actual width of the beam to change in effective mass of the beam. Additional mass structures may include outer edge indentations and/or voids to properly adjust the geometry being exposed to the fabrication process, and the undercut associated with the fabrication process.

Of further note in relation to the example shown in FIG. 4C, each additional mass structure 21 is anchored to spring mechanism 20 at one or more anchor points 22. The exact location of such anchor points 22 further defines the resonance frequency of the whole structure. System designers may adjust the additional mass structure anchor points to further refine the resonance frequency of their design.

The examples described thus far assume that the oscillator elements are all formed from the same constituent material. While this is preferred, it need not always be the case. For example, different constituent materials having similar, yet not identical, responses to a fabrication process might be used to form one or elements (or element portions) in an resonator structure. So long as the respective process-tolerance-induced undercut errors are proportionally controlled as between a resonance frequency defining parameter and a corresponding mass, the present invention finds application.

Taking yet another example, a mass element, like one described in relation to FIGS. 2, 3A, and 3B, might be formed from a second constituent material type having a much higher relative etch rate to that of a first constituent material type used to form a corresponding spring mechanism. Thus, in addition (or in alternative) to the design geometry of the mass element, the selection of its constituent material might be used to maintain little change in the ratio of change in the resonance frequency defining parameter to the actual mass of a corresponding mass element. This is true for hybrid and continuous designs as well as discrete designs.

The foregoing examples describe lateral (Y-direction) oscillators. For such systems, the height of the spring mechanism and/or the height of the mass element do not strongly influence the resonance frequency. However, out-of-plane oscillators may well need to consider the effect of component height on resonance frequency definition.

The present invention may readily be applied to many types of oscillators including those with a variety of sense mechanisms, such as capacitive, piezo-resistive, piezo-electric, etc. Further, a number of different actuation sources are contemplated for oscillators susceptible to the present invention, including electrical, inductive, electrostatic, magnetic, thermal, piezo-electric, etc.

Single crystalline and or poly-silicon is a presently preferred constituent material, but many other materials might be used with good effect.

In addition to the foregoing, the present invention further contemplates the incorporation of temperature compensation to maintain a desired resonance frequency over a prescribed range of operating temperatures. U.S. patent application Ser. No. 10/414,793 filed Apr. 16, 2003 describes various methods and techniques by which the resonance frequency of a MEMS oscillator may be maintained over temperature. This co-pending, commonly assigned application is hereby incorporated in its entirety by reference.

What is claimed is:

1. A method of forming a resonator, comprising:
subjecting a spring-mass mechanism, with an effective mechanical mass and stiffness and including at least one of a void and an indentation in a first section of the spring-mass mechanism, to a single fabrication process, wherein:
the single fabrication process is at least one of a planar process, a surface micromachining process, a gas flow process, and an etching process;
the subjecting of the spring-mass mechanism to the single fabrication process includes simultaneously subjecting indiscriminately as a whole to the single fabrication process both (a) a first section at least partially defined by the at least one of the void and the indentation and (b) a second separate section of the spring-mass mechanism;
due to the simultaneous indiscriminate subjection to the single fabrication process of both the first and second sections as a whole, the single fabrication process acts on exposed surface area of the first section and on exposed surface area of the second section of the spring-mass mechanism to simultaneously remove material from both the first section and the second section;
due to a first ratio of (a) the exposed surface area of the first section to (b) the exposed surface area of the second section, the removal of the material from the first section by the subjection to the single fabrication process is automatically at a greater rate than the removal of the material from the second section by the subjection to the single fabrication process; and the automatic greater rate of removal of the material from the first section than the rate of removal of the material from the second section is automatically at a second ratio due to which, the single fabrication process maintains a third ratio between the effective mechanical stiffness to the effective mechanical mass from prior to the subjecting of the spring-mass mechanism to the process until after completion of the process.

2. The method of claim 1, wherein the spring-mass mechanism includes a spring structure and a mass structure connected to the spring structure, the first section is the mass structure, and the second section is the spring structure.

3. The method of claim 2, wherein:
the spring-mass mechanism includes the void and the indentation;
the indentation includes a plurality of indentations in an outer edge of the mass structure; and
the void is formed in a body of the mass structure.

4. The method of claim 1, wherein the spring-mass mechanism includes a plurality of mass structures and a spring structure that are interconnected, the spring-mass mechanism includes the void, and the void is in a body of at least one of the plurality of mass structures.

5. The method of claim 1, wherein:
the spring-mass mechanism includes a plurality of mass structures and a spring structure that are interconnected, the spring-mass mechanism includes the void and the indentation;
the indentation includes a plurality of indentations in an outer edge of at least one of the mass structures; and
the void is formed in a body of at least one of the mass structures.

6. The method of claim 1, further comprising:
calculating dimensions of the at least one of the void and the indentation as a function of a difference between an initial design width and an expected deviation from the initial design width resulting from the process.

7. The method of claim 1, wherein the spring-mass mechanism includes a spring beam and a mass formed by a plurality of stacked beams, a width of the spring is greater than a width of each of the stacked beams, the void is formed by an interconnection of at least two of the stacked beams.

8. The method of claim 1, wherein the single fabrication process is an exposure of the first and second sections as a whole to an etching gas.

9. The method of claim 1, wherein the single fabrication process is an exposure of the first and second sections as a whole to a wet etch.

10. The method of claim 1, wherein the single fabrication process is an exposure of the first and second sections as a whole to a dry etch.

11. The method of claim 1, wherein the single fabrication process is an exposure of the first and second sections as a whole to a plasma etch.

12. The method of claim 1, wherein the single fabrication process is an exposure of the first and second sections as a whole to a vapor etch.

13. The method of claim 1, wherein the single fabrication process is the planar process.

14. The method of claim 1, wherein the single fabrication process is the surface micromachining process.

15. The method of claim 1, wherein the single fabrication process is the gas flow process.

16. The method of claim 1, wherein the single fabrication process is the etching process.

17. A method, comprising:
subjecting at least a section of a resonator structure, with an effective mechanical mass and stiffness and including at least one of a void and an indentation, to a single fabrication process, wherein:
the single fabrication process is at least one of a planar process, a surface micromachining process, a gas flow process, and an etching process;
the subjecting of the resonator structure to the single fabrication process includes simultaneously indiscriminately subjecting to the single fabrication process, as a whole, the at least the section of the resonator structure, which includes exposed surface area;
due to the simultaneous indiscriminate subjection of the at least the section of the resonator structure as a whole to the single fabrication process, the single fabrication process indiscriminately acts on all of the exposed surface area of the at least the section of the resonator structure to simultaneously indiscriminately remove material across the exposed surface area of the at least the section of the resonator structure;
the exposed surface area is at least partially defined by the at least one of the void and the indentation; and
due to a first ratio of the exposed surface area to non-exposed area of the at least the section of the resonator structure, the removal of the material by the subjection to the single fabrication process is automatically in a manner that maintains a second ratio between the effective mechanical stiffness to the effective mechanical mass from prior to the subjecting of the resonator structure to the process until after completion of the process.

18. The method of claim 17, wherein the resonator structure includes the void and the indentation, the void extends lengthwise in the resonator structure, and the indentation includes a plurality of indentations in an outer edge of the resonator structure.

19. The method of claim 17, wherein the resonator structure includes the void, and the void extends lengthwise in the resonator structure.

20. The method of claim 17, wherein the resonator structure includes a plurality of mass structures.

21. The method of claim 20, wherein the resonator structure includes the void in a body of at least one of the mass structures.

22. The method of claim 17, wherein the automatic maintenance of the second ratio is due to a structure of the at least one of a void and an indentation that causes the indiscriminate subjection to the single fabrication process to cause the removal of the material to be such that a ratio of a reduction of a width of a beam structure to a reduction of a mass to automatically remain approximately constant throughout the removal of the material.

* * * * *